United States Patent
Shimizu et al.

(10) Patent No.: US 6,833,742 B2
(45) Date of Patent: Dec. 21, 2004

(54) STARTER CIRCUIT

(75) Inventors: Yasuhide Shimizu, Nagasaki (JP); Keiko Asai, Nagasaki (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/381,910

(22) PCT Filed: Jul. 29, 2002

(86) PCT No.: PCT/JP02/07681
§ 371 (c)(1),
(2), (4) Date: Jun. 9, 2003

(87) PCT Pub. No.: WO03/015280
PCT Pub. Date: Feb. 20, 2003

(65) Prior Publication Data
US 2004/0004501 A1   Jan. 8, 2004

(51) Int. Cl.[7] .............................. H03L 7/00
(52) U.S. Cl. ................ 327/143; 327/539; 323/313
(58) Field of Search .................. 323/313, 901; 327/142, 143, 198, 539

(56) References Cited

U.S. PATENT DOCUMENTS 6,242,898 B1 * 6/2001 Shimizu et al. .............. 323/313

FOREIGN PATENT DOCUMENTS

| JP | 04-158418 | 6/1992 |
| JP | 06-276077 | 9/1994 |
| JP | 08-6656 | 1/1996 |
| JP | 2000-267749 | 9/2000 |

* cited by examiner

Primary Examiner—Jeffrey Zweizig
(74) Attorney, Agent, or Firm—Sonnenschein, Nath & Rosenthal LLP

(57) ABSTRACT

The present invention is relative to a starter circuit for starting and re-starting a main circuit (20) in startup and during the unusual operation of the main circuit. The starter circuit includes a startup signal supplying unit (11) for supplying a stop signal for stopping the operation of the main circuit when the standby signal is at a standby level, supplying a startup signal to a circuit startup node (22) of the main circuit when the standby signal is changed from the standby level to the startup level and for halting the supply of the stop signal. The starter circuit also includes a start controlling means (12) for halting the supply of the startup signal to the startup signal supply unit when the standby signal is in the startup level and the voltage of the voltage monitor node (21) of the main circuit (20) has reached a predetermined value, and a re-start signal generating means (13) for supplying a re-start signal to the circuit startup node (22) of the main circuit when the standby signal is in the startup level and when the voltage of the voltage monitor node (21) of the main circuit is varied to an unusual value.

8 Claims, 12 Drawing Sheets

FIG.4A PRIOR ART STB
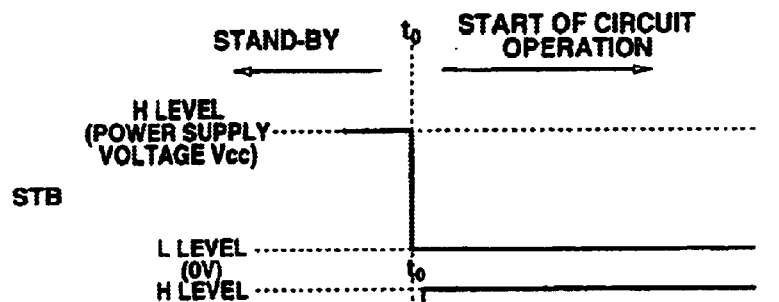
FIG.4B PRIOR ART VOLTAGE OF NODE ND5
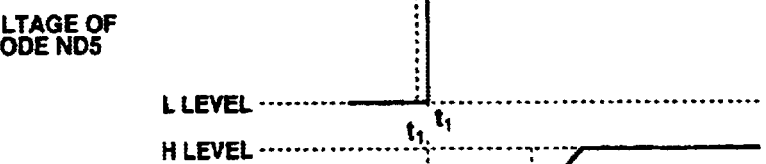
FIG.4C PRIOR ART VOLTAGE OF NODE ND1
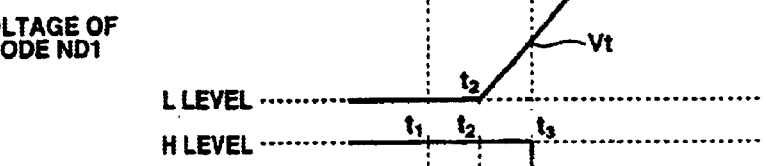
FIG.4D PRIOR ART OUTPUT OF INVERTER INV2
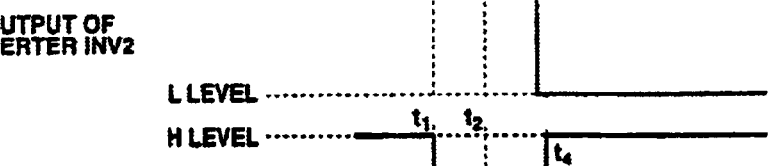
FIG.4E PRIOR ART OUTPUT OF NAND GATE NA1
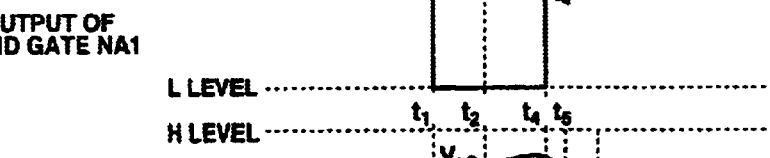
FIG.4F PRIOR ART VOLTAGE OF NODE n1 AND NODE n2
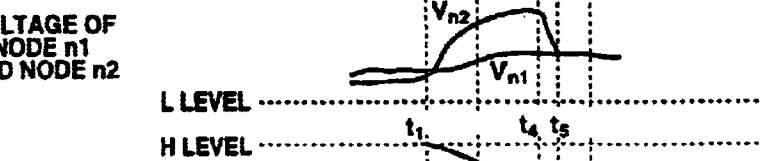
FIG.4G PRIOR ART VOLTAGE OF NODE n3
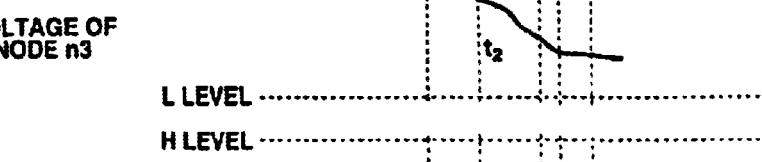
FIG.4H PRIOR ART $V_{OUT}$
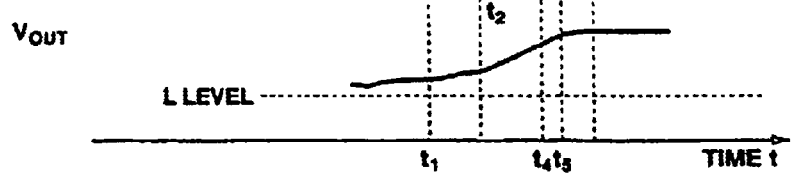

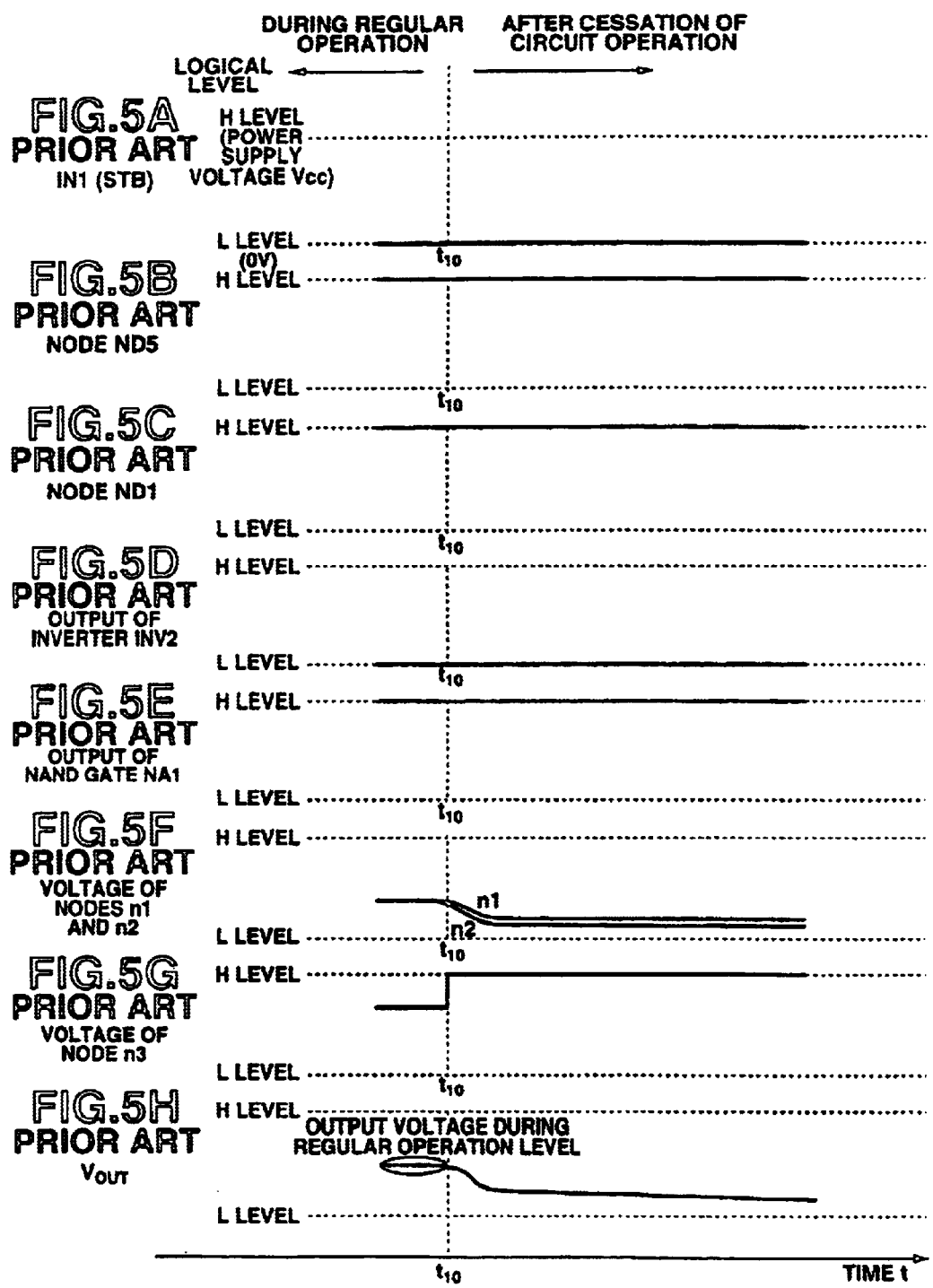

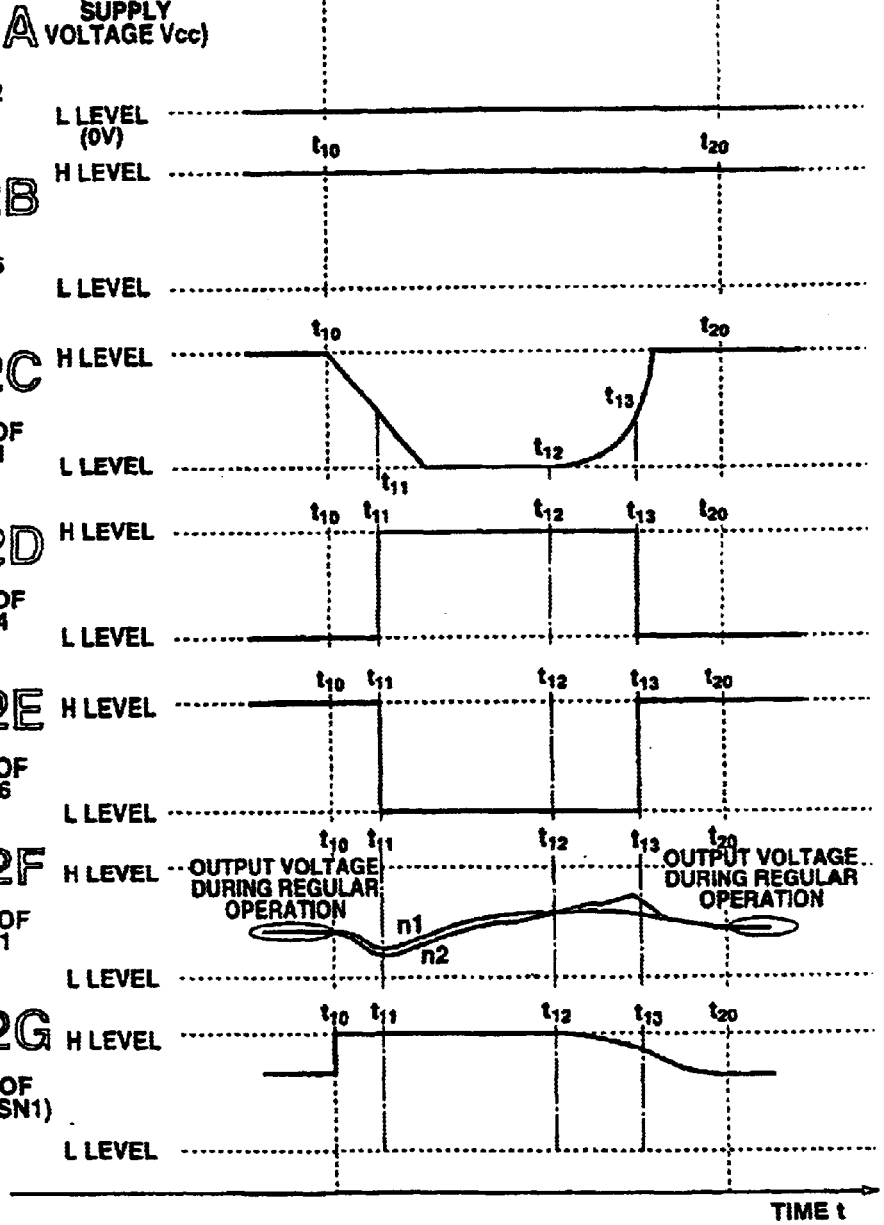

STARTER CIRCUIT

BACKGROUND OF THE INVENTION

This invention relates to a starter circuit built into a main circuit, such as a band gap reference voltage circuit, and which is in operation in startup and during the unusual operation for positively starting and re-starting the main circuit.

Up to now, a circuit the operation of which is not started regularly unless a certain signal is applied to a feedback loop of an operational amplifier in starting the circuit, such as a band gap reference voltage circuit exploiting the feedback of the operational amplifier, is in need of a starter circuit of a simplified circuit structure capable of reliably starting the main circuit.

FIG. 1 shows a circuit typical of this sort of the starter circuit. FIG. 2 shows an instance of a band gap reference voltage circuit as typical of the main circuit started by the starter circuit shown in FIG. 1.

A conventional starter circuit 10u is made up by inverters INV1, INV2 a NAND gate NA1, a delay circuit D101 and pMOS transistors PT2, PT3. The input sides of the inverters INV1, INV2 and the delay circuit D101 are connected to a node ND2, while the output side node ND5 of the inverter INV1 is connected to the gate of the pMOS transistor PT3. An output side node ND4 of the inverter INV2 and an output side node ND7 of the of delay circuit D101 are connected to an input side of the NAND gate NA1. An output side node ND6 of a NAND gate NA1 is connected to the gate of the pMOS transistor PT2. The drain sides of the pMOS transistors PT2, PT3 are connected, as an output terminal OUT1 and a signal terminal SN1, respectively, to a terminal $T_{n2}$ and to a terminal $T_{n3}$, respectively. These terminals $T_{n2}$ and $T_{n3}$ are connected to a node n2, as a voltage monitor point of a band gap reference voltage circuit 20u, now explained, and to a node n3, as a common gate of transistors T101, T102 and T103, respectively.

Referring to FIG. 2, the band gap reference voltage circuit 20u is made up by an operational amplifier OPA1, pMOS transistors T101, T102 and T103 and by npn transistors B101, B102 and B103, connected in a diode configuration. The transistor T101, a resistor R101 and the transistor B101, connected in a diode configuration, are connected in series across a supply line of a power supply voltage Vcc and a supply line of a reference voltage, herein a ground potential GND, while the transistor T102 and the transistor B102, connected in a diode configuration, are connected in series across the supply line of the power supply voltage Vcc and the ground potential GND. The transistor T103, resistor R102 and the transistor B103 is connected in series across the supply line of the power supply voltage Vcc and the ground potential GND.

The gates of the transistors T101, T102 and T103 are all connected to an output terminal n3 of the operational amplifier OPA1.

The operational amplifier OPA1 has its non-inverting input terminal (+) connected to the node n1, as a junction across the transistor T101 and the resistor R101, while having its inverting input terminal (−) connected to the node n2, as a junction across the transistor T102 and the transistor B102. An output signal of the operational amplifier OPA1 is coupled to the gates of the transistors T101, T102 and T103. Thus, a feedback loop is formed by the operational amplifier OPA1 and, by this feedback loop, the currents I1, I2 and I3 of the transistors T101, T102 and T103 are controlled so that the voltages at the nodes n1 and n2 are equal to each other during the regular operation, as a result of which a stable voltage $V_{OUT}$ showing no dependency on the power supply voltage Vcc nor temperature dependency is output at an output terminal $T_{OUT}$.

The foregoing is an explanation of the operation when the band gap reference voltage circuit 20u performs a regular operation. However, with the band gap reference voltage circuit 20u by itself, that is the band gap reference voltage circuit devoid of the starter circuit 10u, there are cases wherein, due to variations in the voltage rise in startup, the voltage $V_{n1}$ at the node n1 is higher than the voltage $V_{n2}$ at the node n2, that is $V_{n1} > V_{n2}$. In such cases, the signal voltage input to the non-inverting input terminal (+) is higher than the signal voltage input to its inverting input terminal (−), so that the operational amplifier continues to output a high-level signal, and hence the transistors T101, T102 and T103 continue to be off. In such state, the band gap reference voltage circuit 20u cannot operate as normally.

Thus, the voltage $V_{n2}$ at the node n2 is compulsorily made higher than the voltage $V_{n1}$ at the node n1 by the starter circuit 10u to set up a normal operating state of the band gap reference voltage circuit 20u, with the transistors T101, T102 and T103 being turned off in the interim. When the band gap reference voltage circuit 20u is in the normal operating state, the transistors T101, T102 and T103 exit from the turned-off state.

In the starter circuit 10u, shown in FIG. 1, a stand-by signal STB, which is at a high level in the stand-by (operation cessation) state and at a low level in the power supplying state, is input to the input terminal IN1 of the starter circuit 10u. When the stand-by signal STB is in the high level, the output terminal ND4 of the inverter INV2 is in the low level, while an output terminal ND7 of the delay circuit D101 is at a high level in the steady operating state. Consequently, the voltage of the node ND6 on the output side of the NAND gate NA1 is at a high level. The pMOS transistor PT2 is then turned off, while the drain-source current path of the pMOS transistor PT2 in a state of high impedance. Simultaneously, the standby signal STB is at a high level, so that a node ND5 on the output side of the inverter INV1 is in the low level, with the pMOS transistor PT3 being in the turned-on state. Thus, the signal terminal SN1 is at a high level. The transistors T101, T102 and T103 of the band gap reference voltage circuit 20u are turned off, such that the current is supplied to the source of the output transistor T103, however, there is no output of the constant voltage at the output terminal $T_{OUT}$.

When the voltage of the signal input to the input terminal IN1 is changed from the high level to the low level, the output side node ND5 of the inverter INV1 goes to a high level to turn off the pMOS transistor PT3 so that the potential of the node n3 of the band gap reference voltage circuit 20u is the output voltage of the operational amplifier OPA1. On the other hand, the output side node ND4 of the inverter INV2 goes to a high level, while the output side node ND7 of the delay circuit D101 goes to a high level during the delay time Δtd. Consequently, the potential of the output side node ND6 of the NAND gate NA1 goes to a low level. Thus, the pMOS transistor PT2 is turned on so that the terminal OUT1 goes to a high level. This forcibly pulls up the potential of the node n2 to near the Vcc level. Since the voltage applied to the inverting input terminal (−) of the operational amplifier OPA1 goes to a low level, the node n3 of the output side of the operational amplifier OPA1 goes to a low level, thus turning on the three transistors T101, T102 and T103. After the delay time Δtd, the output of the delay circuit D101 goes to a low level, so that the output node ND6 of the NAND gate ND1 is at a high level and hence the pMOS transistor ND6 is at a high level. This turns off the pMOS transistor PT2 to isolate the starter circuit from the band gap reference voltage circuit 20u, to permit the band gap reference voltage circuit 20u to start the operation by itself.

By the above-described control in which the transistor PT3 is turned off by the starter circuit 10u after startup of the circuit, and in which the transistor PT2 is turned on for a certain preset time and subsequently turned off, the above-described conventional band gap reference voltage circuit 20u can be started as normally without regard to the voltage of the nodes n1 and n2 during the time of cessation of the circuit operation. It is noted that, if the transistor PT2 continues to be on, the feedback loop comprised of the operational amplifier OPA1 cannot be operated as normally, such that the operational amplifier OPA1 cannot control the transistors T101, T102 and T103. Thus, a control signal S1, controlling the on-time of the transistor PT2 by the delay time of the delay circuit D101, is generated.

In the conventional starter circuit 10u, shown in FIG. 1, the switching of the signal level of the signal S1 is not performed after certifying the operating state of the band gap reference voltage circuit 20u, but the delay time is set empirically, and hence the switching time is not necessarily set to an optimum value. If this switching time is too long, the startup time of the band gap reference voltage circuit 20u is elongated to more than a necessary extent to deteriorate the startup characteristics. If conversely the switching time is too short, the starter circuit 10u is halted before the voltage $V_{n2}$ of the node n2 becomes sufficiently high, such that there is the possibility that the band gap reference voltage circuit 20u is not started as normally. This starter circuit 10u is not entirely satisfactory in that it is in need of elaborate care in designing while being susceptible to variations in tolerance in manufacture and to changes in the conditions of the circuit operation.

For overcoming the problems inherent in the starter circuit 10u of FIG. 1, the present assignees have proposed a starter circuit in which the starter circuit is isolated from the band gap reference voltage circuit after confirming that the band gap reference voltage circuit is stabilized in operation, without dependency on the delay time, as disclosed in the Japanese Laying-Open Patent Publication 2000-267749. The starter circuit disclosed in this Laying-Open Patent Publication is shown in FIG. 3.

A starter circuit 10v, shown in FIG. 3, is made up by pMOS transistors PT1, PT2, PT3, a nMOS transistor NT1, inverters INV1, INV2, and a NAND gate NA1.

The pMOS transistor PT1 and the nMOS transistor NT1 are connected in series across a supply line of the power supply voltage Vcc and the ground potential GND. The gate of the transistor PT1 is connected to a signal terminal SN1, while the gate of the transistor NT1 is connected to the input terminal IN1. The junction of the drains of the transistors PT1 and NT1 is connected to the node ND1. The input terminal of the inverter INV1 is connected to the node ND1, while the input terminal of the inverter INV2 is connected to the node ND1. The two input terminals of the NAND gate NA1 are connected to the output terminals of the inverters INV1 and INV2. The transistor PT2 has its gate connected to an output terminal of the NAND gate NA1, while having its source and drain connected to the supply line of the power supply voltage Vcc and to an output terminal OUT1. The transistor PT3 has its gate connected to an output terminal of the inverter INV1, while having its source and drain connected to the supply line of the power supply voltage Vcc and to the signal terminal SN1, respectively. As in the starter circuit 10u, shown in FIG. 1, the output terminal OUT1 is connected to the operating node n2 in a main circuit, for example, in the band gap reference voltage circuit 20u of FIG. 2, the voltage of which needs to be transiently boosted for startup, while the signal terminal SN1 is connected to the operating node n3 which is fixed during the time of operation cessation to the voltage of the power supply voltage Vcc and which needs to be lowered on starting the operation from the power supply voltage Vcc to a voltage sufficient to turn on the pMOS transistors T101, T102 and T103.

FIG. 4 shows a timing chart illustrating the operation on startup of the starter circuit 10u shown in FIG. 3. Referring to FIGS. 4 and 3 and to the band gap reference voltage circuit 20u, shown in FIG. 2 as typical of the main circuit, the operation of the starter circuit 10v shown in FIG. 3 is now explained.

Referring to FIG. 4A, the standby signal STB, which is at a high level during standby (cessation of operation) and which is changed over to a low level on starting the operation as from time $t_0$, is applied to the input terminal IN1 of the starter circuit 10v.

In the standby state, the potential of a node ND2 of the input terminal IN1 is at a high level, so that an output side node ND5 of the inverter INV1 is at a low level. Since the transistor NT1 is on, a node ND1 is at a low level, such as at a level of the ground potential GND. Since the output terminal of the NAND gate NA1 is maintained at a high level, depending on the output signals of the inverters INV1 and INV2, the transistor PT2 is in the off state. On the other hand since the gate of the transistor PT3 is at a low level, the transistor PT3 is on, so that the signal terminal SN1 is maintained at a high level, for example, at or near the supply voltage Vcc.

If the standby signal STB is changed over at time $t_0$ from the high level to the low level, as shown in FIG. 4A, the potential of the output side node ND5 of the inverter INV1 is changed over from the low level to the high level with a slight time lag as from the decay of the standby signal STB (at a time $t_1$) as shown in FIG. 4B. This turns the transistor PT3 off. However, the signal terminal SN1 is kept at a high level, as long as no new signal is supplied at the signal terminal SN1.

When the standby signal STB is at the low level, the transistor NT1 is changed over from the on-state to the off-state. However, since the signal terminal SN1 is maintained at a high level, the transistor PT1 is simultaneously turned off, so that the node ND1 is in the high impedance state. Consequently, the voltage at the node ND1 is not changed, and is kept at a low level, as shown in FIG. 4C.

Since the two input terminals of the NAND gate NA1 at this time are both at a high level, the output side node ND6 of the NAND gate NA1 is kept at a low level, as shown in FIG. 4E. This turns on the transistor PT2 to supply the startup current $I_{ST}$ to the output terminal OUT1. Responsive to the current $I_{ST}$, supplied from the output terminal OUT1, the band gap reference voltage circuit 20u, shown in FIG. 2, for example, commences its operation. FIG. 4G shows the output voltage of the operational amplifier OPA1, that is the voltage at the node n3, with respect to the voltage $V_{n1}$ at the node n1 and the voltage $V_{n2}$ at the node n2. When the voltage $V_{n2}$ at the node n2 rises, the voltage at the node n3, that is the voltage at the signal terminal SN1, begins to be lowered, as shown in FIG. 4G. Concomitantly, the source-drain resistance of the pMOS transistor PT1 begins to be decreased, such that the potential of the node ND1 is increased as from the time point $t_2$, as shown in FIG. 4C.

When the voltage of the node ND1 exceeds the logical threshold value $V_t$ of the inverter INV2, the voltage at the output terminal of the inverter INV2 is changed over at time point $t_3$ from the high level to the low level, as shown in FIG. 4D. Then, at a time point $t_4$, slightly delayed from the time point $t_3$, the potential of the output terminal of the NAND gate NA1 is changed over from the low level to the high level, as shown in FIG. 4E. This turns off the pMOS transistor PT2 to lower the potential $V_{n2}$ of the node n2 of the band gap reference voltage circuit 20$u$, as shown in FIG. 4F. At a time point when the potential $V_{n2}$ at the inverting input of the operational amplifier OPA1 is at the same level as the potential $V_{n1}$ at its non-inverting input (time point $t_5$), the regular operation of generating the reference voltage by the operation of the operational amplifier OPA1 is restored (see FIGS. 4G and 4H).

Thus, with the starter circuit 10$v$, shown in FIG. 3, the operation of the starter circuit 10$v$ comes to a close after confirming that the voltage at the voltage monitor node of the band gap reference voltage circuit 20$u$ is of a preset value, thus achieving a reliable startup operation.

Meanwhile, with the starter circuit 10$v$, shown in FIG. 3, the above-described startup operation is achieved by applying the standby signal STB, which is at a high level during cessation of the circuit operation and which is at a low level on startup of the circuit operation, to the starter circuit 10$v$ at the time of the startup operation.

However, in a main circuit, such as the band gap reference voltage circuit, it may be an occurrence that the regular operation is not started on power up, or the operation of the main circuit is halted by some reason or other during its regular operation.

FIG. 5 depicts a time chart showing this operating condition. FIG. 5A shows the standby signal STB applied to the terminal IN1. The standby signal is maintained at a low level after startup. Consequently, the potential of the output side node ND5 of the inverter INV1 is at a high level. The potential of the output side node ND1 of the nMOS transistor NT1 is at a high level, as shown in FIG. 5C, since the nMOS transistor NT1 is off, with the impedance in the source-drain current path being high. Consequently, the output side node ND4 of the inverter INV2 is at a low level, as shown in FIG. 5D, while the output side node ND6 of the NAND gate NA1 is at a high level, as shown in FIG. 5E. In this state, the pMOS transistors PT2 and PT3 are both off and the potentials of the nodes n1, n2 and n3 of the band gap reference voltage circuit 20$u$, shown in FIG. 2, are regular, as shown in FIGS. 5F and 5G, with the output voltage $V_{OUT}$ being a preset constant voltage, as shown in FIG. 5H.

If, in this normal operating state, the transistors T101 and T102 operate unusually at a time $t_{10}$ by some reason or other, such that there is produced a difference between the voltage at the non-inverting input side node n1 and that at the inverting input side node n2 of the operational amplifier OPA1 of the band gap reference voltage circuit 20$u$, as shown in FIG. 5F, such that the node n2 is at a lower potential than the node n1, the offset voltage of the operational amplifier OPA1 is amplified to the vicinity of the power supply voltage Vcc which is the maximum voltage. The transistors T101 to T103 are then turned off so that the feedback by the operational amplifier OPA1 is not prosecuted and hence the output voltage $V_{OUT}$ is not a constant voltage, as shown in FIG. 5H.

If the band gap reference voltage circuit 20$u$ is in this unusual state, the starter circuit 10$v$ is unable to produce any action on the band gap reference voltage circuit 20$u$, because the pMOS transistors PT2 and PT3 are in the off state.

That is, the conventional starter circuit, in which the operation is started only on startup by the standby signal STB, cannot perform the startup operation a second time when the main circuit has fallen into unusual operating state after once it is started.

SUMMARY OF THE INVENTION

It is therefore an object of the present invention to provide a starter circuit which not only has the merit of the starter circuit shown in FIG. 3 of assuring prompt startup of the main circuit, such as the band gap reference voltage circuit, without relying upon a preset delay time, but also is capable of re-starting the main circuit, even if the main circuit is unable to perform a regular operation by some reason or other, or if the main circuit halts its operation after once it is started.

The present invention provides a starter circuit for a main circuit, connected to a preset voltage monitor node and to a preset circuit startup node in the main circuit, comprising startup signal supplying means which, on receipt of a standby signal, changed in voltage on startup from a standby level to a start level in a bi-level fashion, supplies a stop signal for stopping the operation of the main circuit when the standby signal is at a standby level, and which supplies a startup signal to the circuit startup node of the main circuit and halts the supply of the stop signal when the standby signal is changed from the standby level to the start level, startup controlling means for stopping the supply of the startup signal when the standby signal is at a startup level and when the voltage at the voltage monitor node of the main circuit has reached a predetermined value, and re-start signal generating means for supplying a re-start signal to the circuit startup node of the main circuit when the standby signal is at the startup level and the voltage of the voltage monitor node of the main circuit is changed from the preset value to an unusual value.

In the startup circuit according to the present invention, if the main circuit fails to start its regular operation, or if the main circuit, operating as normally, has halted the operation by some reason or other, the voltage at the voltage monitor node of the main circuit is of an unusual value. In such case, the re-start signal generating means is actuated to supply a re-start signal to the circuit start node of the main circuit to re-start the main circuit. When the voltage of the voltage monitor node reaches a predetermined value, the re-start signal ceases so that the main circuit is in the usual operating mode.

Other objects, features and advantages of the present invention will become more apparent from reading the embodiments of the present invention as shown in the drawings.

BRIEF DESCRIPTION OF THE DRAWINGS

FIGS. 4A to 4H are timing charts showing the operation on startup of the starter circuit shown in FIG. 3.

FIGS. 5A to 5H are timing charts showing voltage changes in the respective component parts of the starter circuit of FIG. 3, after cessation of the circuit operation of the starter circuit shown in FIG. 3.

FIGS. 12A to 12G are timing charts showing voltage changes in the respective component parts after cessation of the operation in the circuit shown in FIG. 11.

DETAILED DESCRIPTION OF THE PRESENTLY PREFERRED EMBODIMENTS

Figure 1:
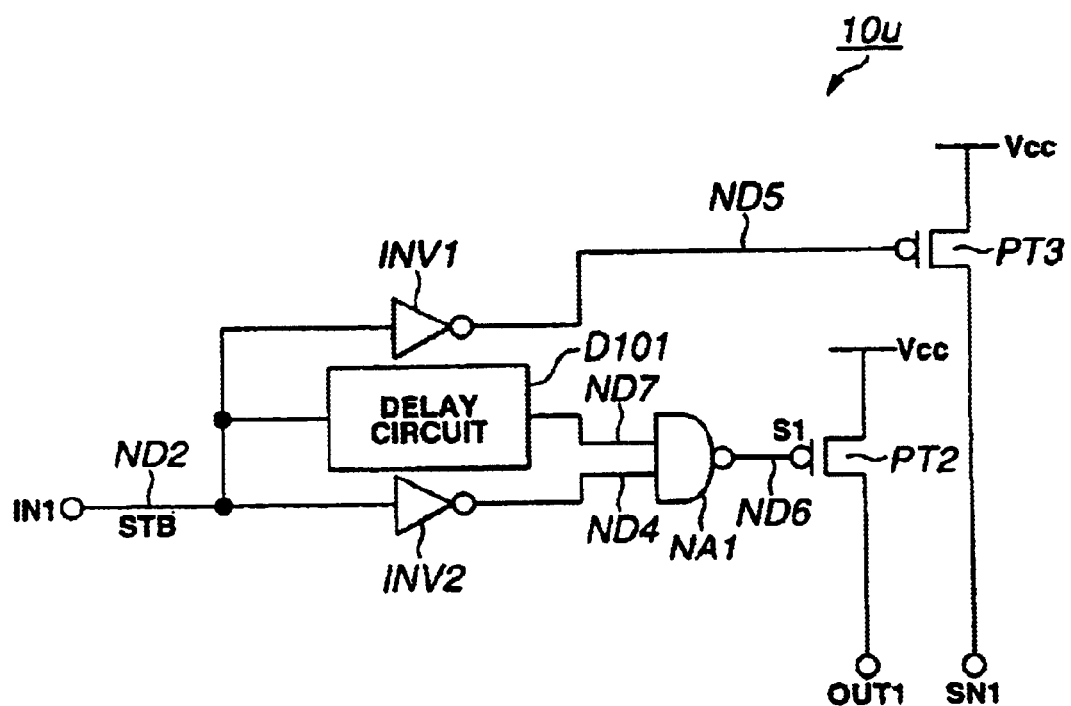
FIG. 1 is a circuit diagram showing an instance of a conventional starter circuit.

Referring to the drawings, preferred embodiments of the present invention are explained in detail.

<First Embodiment>

Figure 6:
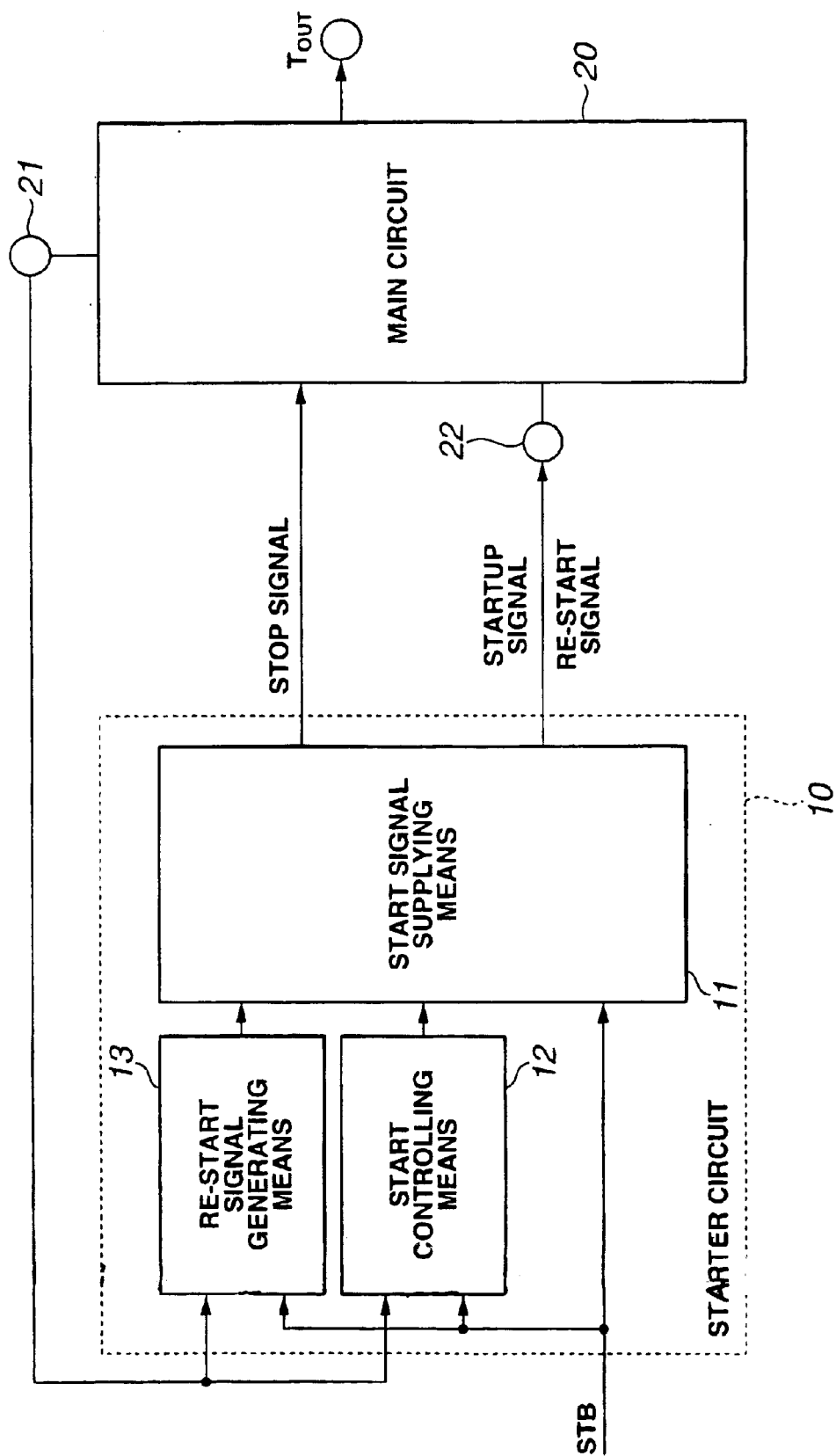
FIG. 6 is a functional block diagram showing a first embodiment of the present invention.

FIG. 6 is a functional block diagram showing a first embodiment of the present invention. A starter circuit 10 of the present embodiment is made up by a startup signal supplying means 11, a start controlling means 12 and a re-start signal generating means 13. A main circuit 20, connected to the starter circuit 10, includes a voltage monitor node 21, a circuit startup node 22 and an output terminal $T_{OUT}$.

The start signal supplying means 11 is responsive to a standby signal STB, changed in voltage in startup between two levels, that is a standby level and a start level, to supply a stop signal for cessation of the operation of the main circuit 20 when the standby signal STB is at a standby level, and to supply a start signal to the circuit starting node 22 of the main circuit 20, as well as to stop the supply of the cessation signal, when the standby signal is changed from the standby level to the start level.

If, after the standby signal has reached the startup level, the voltage at the voltage monitor node 21 of the main circuit 20 has reached a preset value, the start controlling means 12 halts the supply of start signals to the start signal supplying means 11.

If, after the standby signal has reached the status of the startup level, the voltage at the voltage monitor node 21 of the main circuit 20 is changed from a preset value to an unusual value, the re-start signal generating means 13 sends a re-start signal to the circuit starting node 22 of the main circuit 20 through the start signal supplying means 11.

Thus, if, after the standby signal is changed from the standby level to the startup level, the main circuit 20 has not started the regular operation, or the main circuit 20, so far operating as normally, has halted its operation by some reason or other, the voltage of the voltage monitor node 21 of the main circuit 20 is of an unusual value. Consequently, the re-start signal generating means 13 is actuated to send the re-start signal to the circuit starting node 22 to re-start the main circuit 20. When the voltage at the voltage monitor node 21 of the main circuit 20 has reached a preset value, the re-start signal generating means 13 detects this to halt the re-start signal. The main circuit 20 then is in the normal operating state to output a predetermined voltage at the output terminal $T_{OUT}$.

<Second Embodiment>

Figure 7:
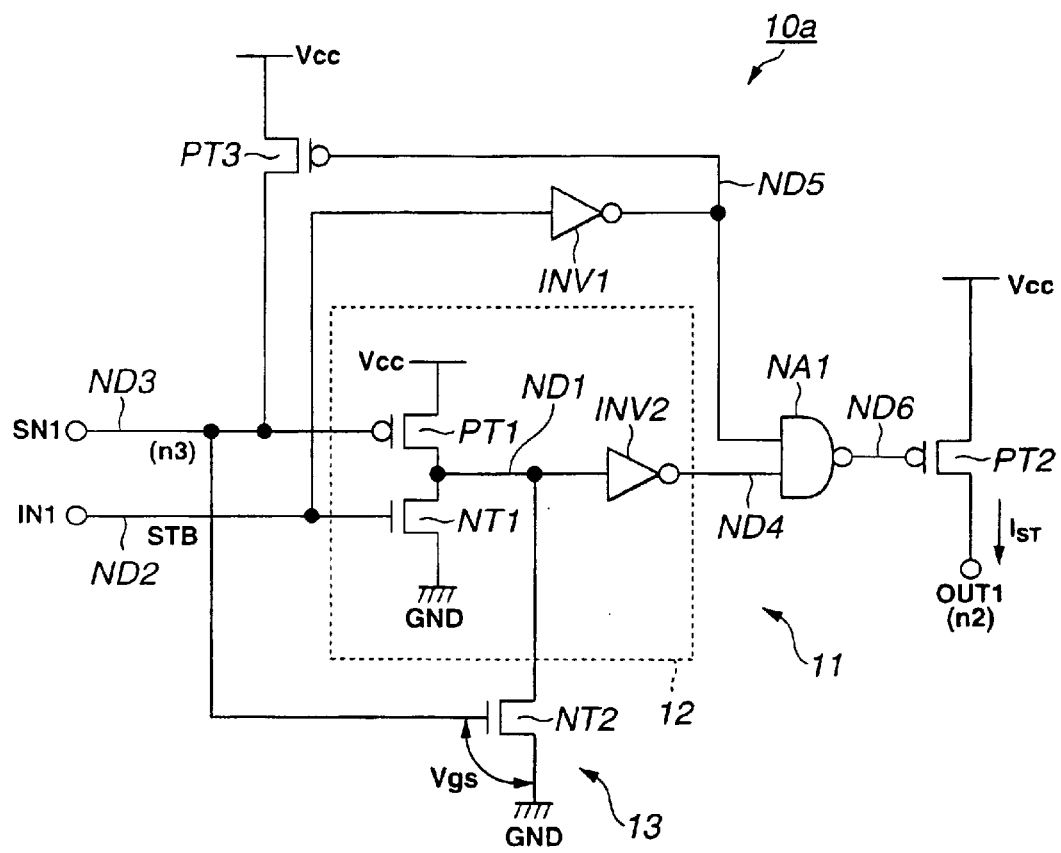
FIG. 7 is a circuit diagram showing a second embodiment of the present invention.

FIG. 7 shows a starter circuit 10a according to a second embodiment of the present invention. This starter circuit includes an inverter INV1, a NAND gate NA1 and pMOS transistors PT2 and PT3, forming a start signal supplying means 11, a pMOS transistor PT1, a nMOS transistor NT1 and an inverter INV2, forming a start controlling means 12, and a n-MOS transistor NT2, forming a re-start signal generating means 13.

For implementing a circuit of low power consumption, the above transistors are field-effect transistors, in particular MOS (metal oxide semiconductor) field-effect transistors.

The transistors PT1 and NT1 are connected in series across the feed line of the power supply voltage VCC and the ground potential GND. The gate of the transistor PT1 is connected to a signal terminal SN1, while the gate of the transistor NT1 is connected to an input terminal IN1. The drains of the transistors PT1 and NT1 are connected in common and connected to the node ND1. The input terminal of the inverter INV1 is connected to the input terminal IN1, while the input terminal of the inverter INV2 is connected to the node ND1. The two inputs of the NAND gate NA1 are connected to output terminals of the inverters INV1 and INV2. The transistor PT2 has its gate connected to an output terminal of the NAND gate NA1, while having its source and drain connected to the supply line of the power supply voltage Vcc and to an output terminal OUT1, respectively. The transistor PT3 has its gate connected to an output terminal of the inverter INV1, while having its source and drain connected to the supply line of the power supply voltage Vcc and to the signal terminal SN1, respectively. The drain-source current path of the n-MOS transistor NT2 is connected across the node ND1 and the ground potential GND, whilst its gate is connected to the signal terminal IN1.

Figure 2:
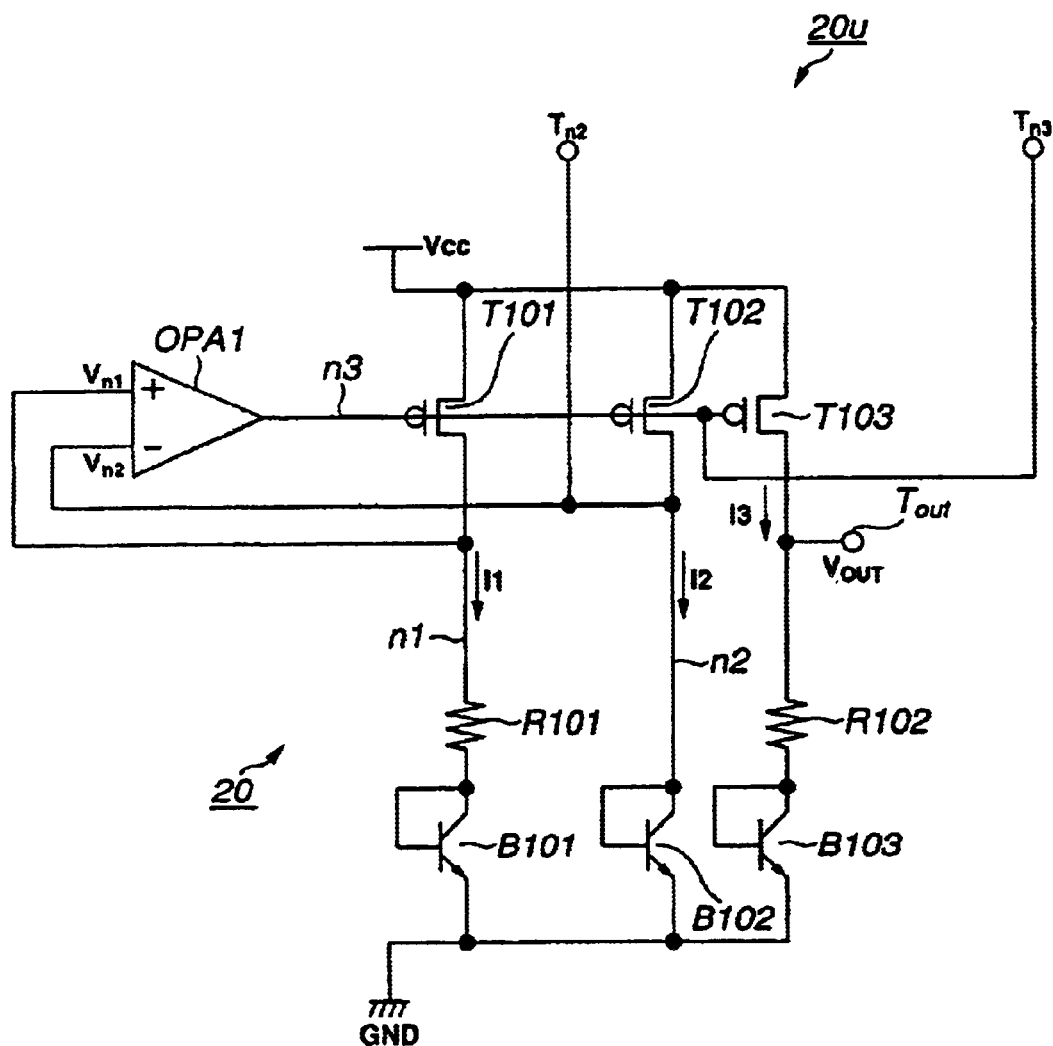
FIG. 2 is a circuit diagram showing an instance of a band gap reference voltage circuit.

With the starter circuit 10a, described above, a standby signal STB for halting and starting the operation in the high level and in the low level, respectively, is supplied to the input terminal IN1, while a node n2, as a point of transient voltage boosting for starting the main circuit, such as the band gap reference voltage circuit 20u, already explained with reference to FIG. 2, is connected to the output terminal OUT1. The signal terminal SN1 of the starter circuit 10a is connected to a node n3 which is a point where the voltage is fixed at the power supply voltage Vcc during cessation of the operation in the main circuit and where the voltage is lowered from the power supply voltage Vcc to a magnitude sufficient to turn on the pMOS transistor PT1 when the main circuit is in operation.

The operation of the starter circuit 10a at the startup time is now explained.

The input terminal of the starter circuit 10a is supplied with the standby signal STB which goes to a high level and to a low level during standby (during cessation of the circuit operation) and after the start of the operation, respectively.

In the stand-by state, the potential of the node ND2 of the input terminal IN1 is at a high level, so that the output side node ND5 of the inverter INV1 is at a low level. Since the transistor NT1 is on, the node ND1 is at a low level, for example, at the level of the ground potential GND. Responsive to the output signals of the inverters INV1, INV2, the output terminal of the NAND gate NA1 is maintained at a high level, so that the transistor PT2 is off. On the other hand, since the gate of the transistor PT3 is at the low level, the transistor PT3 is on, so that the signal terminal SN1 is maintained at a high level, that is at a level close to the power supply voltage Vcc. At this time, the pMOS transistor PT1, having its gate potential at a high level, is turned off, while the nMOS transistor NT2 is on.

When the standby signal STB is changed over from the high level to the low level, the potential of the output node ND5 of the inverter INV1 is changed over from the low level to the high level, with a slight time lag as from the decay of the standby signal STB. This turns off the transistor PT3. However, the signal terminal SN1 is kept at a high level, as long as no new signal is supplied at the signal terminal SN1.

As described above, when the standby signal STB goes to a low level, the transistor NT1 is changed from the on-state to the off-state, while the signal terminal SN1 is kept at a high level, so that the transistor PT1 is simultaneously turned off. On the other hand, since the signal terminal SN1 keeps on to be at a high level, the transistor NT2 is on, with the impedance in its source-gate current path being low, and hence the voltage of the node ND1 is not changed and kept at the low level.

At this time, the two output terminals of the NAND gate NA1 are at a high level, so that the output side node ND6 of the NAND gate NA1 is kept at a low level. This turns on the transistor PT2 to supply the startup current $I_{ST}$ to the output terminal OUT1. Responsive to the current $I_{ST}$, supplied from the output terminal OUT1, the main circuit, for example, the band gap reference voltage circuit 20u, starts its operation. When the main circuit 20 is the steady operating state, the voltage at the signal terminal SN1, for example, the voltage at the node n3 of the band gap reference voltage circuit 20u, begins to be lowered. As a consequence, the source-drain resistance of the pMOS transistor PT1 begins to be decreased, at the same time as the source-drain resistance of the nMOS transistor NT2 begins to be increased. This raises the potential of the node ND1. At a certain time point, the output terminal ND4 of the inverter INV2 is changed over from the high level to the low level, such that the output terminal of the NAND gate NA1 is changed over from the low level to the high level. This turns off the pMOS transistor PT2, such that the main circuit, for example, the band gap reference voltage circuit 20u, reverts to its normal operation.

The operation of the starter circuit 10a when the main circuit, so far operating as normally, has halted the operation, by some reason or other, as the standby signal STB is kept in the low level, is hereinafter explained.

First, when the standby terminal IN1 is at the low level and the main communication is operating as normally, the nodes ND2 and ND5 are at the low level and at the high level, respectively. The signal terminal SN1 is connected to a point n3 where the voltage is lowered to a value sufficient to turn on the pMOS transistor PT1. Thus, the voltage at the node ND3 is lowered to a value sufficient to turn on the pMOS transistor PT1 during the normal operation of the main circuit. At this time, the pMOS transistor PT3 is turned off, because the node ND5 is at a high level.

On the other hand, the node ND3 is at a low level, so that the pMOS transistor PT1 is on, while the nMOS transistor NT1 is off. The voltage of the node ND3, as the gate voltage of the nMOS transistor NT2, is at a low level, so that the voltage $V_{gs}$ of the gate-source current path of the nMOS transistor NT2 is smaller than when the gate voltage is at a high level, and hence the operating range is such that the on-resistance of the transistor NT2 appears to be larger, with the node ND1 being at a high level. Consequently, the output side node ND6 of the NAND gate NA1 is at a high level, and hence the pMOS transistor PT2 is off.

If, with the standby signal STB remaining at the low level, the main circuit, so far operating as normally, has halted its operation, by some reason or other, the node ND2 of the output terminal IN1 keeps on to be at a low level, while the output side node ND5 of the inverter INV1 keeps on to be at a high level, so that the pMOS transistor PT3 keeps on to be off. On the other hand, during cessation of the operation of the main circuit, the signal terminal SN1 is at a high level indicating the unusual state. At this time, the pMOS transistor PT1 and the nMOS transistor NT1 are both turned off, while the nMOS transistor NT2, having its gate at the high level, is turned on. Since the gate source voltage $V_{gs}$ of the nMOS transistor NT2 is of a larger value, the on-resistance of this transistor appears to be smaller, so that the node ND1 is at a low level. Thus, the output side node ND4 of the inverter INV2 is at a high level, while the output side node ND6 of he NAND gate NA1 is at a low level. Consequently, the pMOS transistor PT2 is turned onto cause the startup current $I_{ST}$ to flow from the output terminal OUT1 through the terminal $T_{n2}$ to the main circuit, for example, the band gap reference voltage circuit 20u, to cause the main circuit to start its operation.

When the main circuit starts to be reverted to the normal operation, the voltage at the signal terminal SN1 begins to be lowered again to a voltage sufficient to turn the transistor PT1 on. When the voltage of the node ND3 is lowered to a voltage sufficient to turn on the transistor PT1, the pMOS transistor PT1 is turned on, while the nMOS transistor NT1 is turned off. As for the voltage of the nMOS transistor NT2, the voltage of the gate source current path $V_{gs}$ is smaller at this time than when the gate voltage is at a high level, with the operating range being such that the on-resistance of the transistor appears to be larger, so that the potential of the node ND1 is raised to the high level. Consequently, the output side node ND4 of the inverter INV2 is at a low level, so that the potential of the output side node ND6 of the NAND gate NA1 is at a high level and hence the pMOS transistor PT2 is again turned off. The band gap reference voltage circuit 20u, as the main circuit, begins its regular operation.

Figure 3:
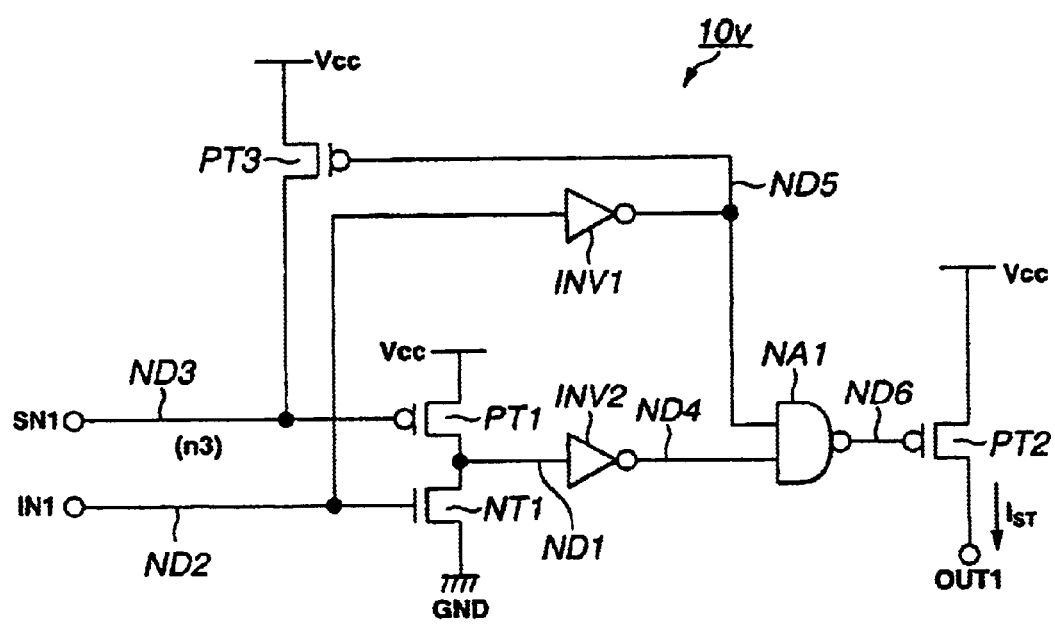
FIG. 3 is a circuit diagram showing an instance of another conventional starter circuit.

Thus, the starter circuit 10a of the second embodiment, shown in FIG. 7, perpetually monitors the state of failure of the main circuit in performing the regular operation in startup, or the state of the main circuit halting its operation during its regular operation, by some reason or other, and begins its operation automatically, so that the problem referred to in the explanation of the starter circuit 10V shown in FIG. 3 is not raised.

In the starter circuit 10a, according to the second embodiment of the present invention, the on-resistance of the transistor NT2 is designed to be changed efficiently as necessary, at a lower power consumption, so that, when the node ND1 is to be at the low level or at the high level, the on-resistance of the transistor NT2 will be decreased or increased, respectively. The circuitry forming the re-start signal generating means 13 forming in turn the starter circuit 10a of the second embodiment may be implemented by adding a sole n-MOS transistor NT2 to the circuitry of the conventional technique 2.

<Third Embodiment>

Figure 8:
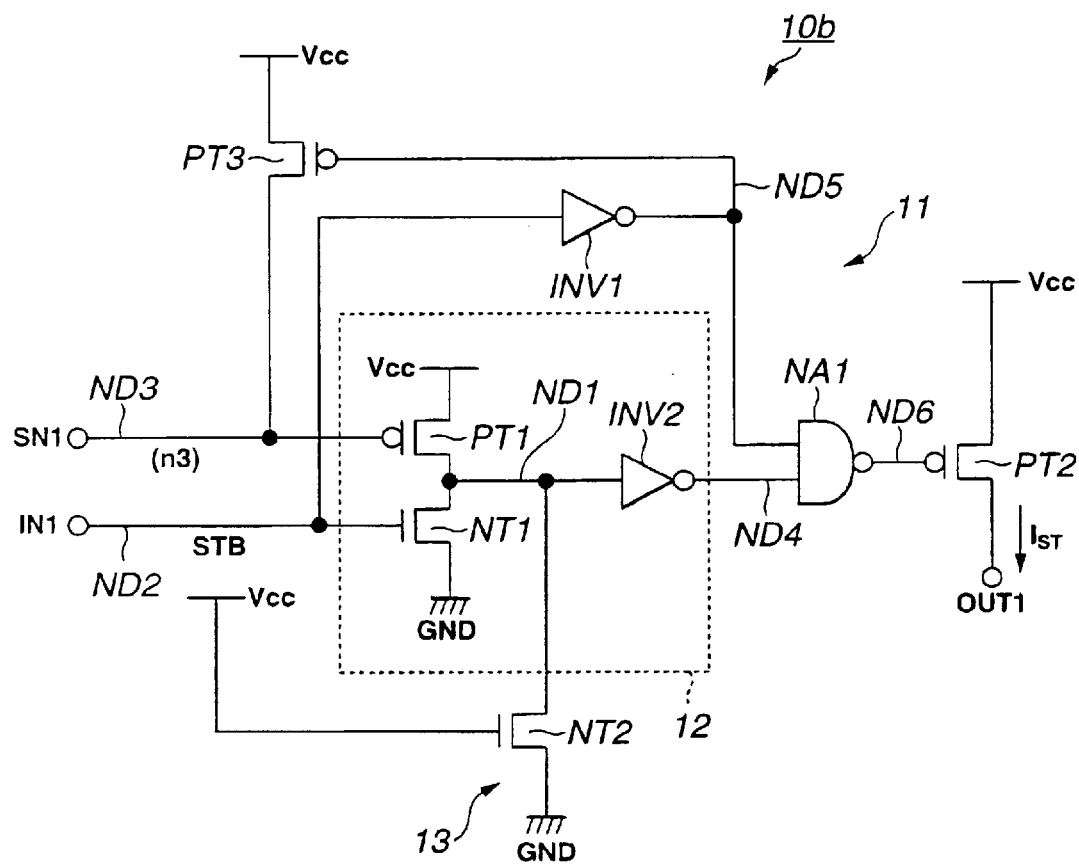
FIG. 8 is a circuit diagram showing a third embodiment of the present invention.

FIG. 8 shows a starter circuit 10b according to the present invention. This starter circuit 10b is of a structure common to the structure of the second embodiment shown in FIG. 7 except that the gate of the n-MOS transistor NT2 is connected not to the signal terminal SN1 but to the power supply voltage Vcc. In this third embodiment, the gate voltage of the n-MOS transistor NT2 is connected to the power supply voltage Vcc, so that the n-MOS transistor NT2 operates in the on-state. Thus, the on-resistance of the n-MOS transistor NT2 is connected across the node ND1 and the ground GND. In distinction from the second embodiment, this on-resistance is not changed no matter whether the signal terminal SN1 is at the high or low level. However, by setting the on-resistance so as to be larger than the on-resistance and smaller than the off-resistance of the pMOS transistor PT1 and the n-MOS transistor NT1, the starter circuit 10b operates similarly to the starter circuit 10a of the second embodiment, as now explained.

The start-up operation of the of the present third embodiment is hereinafter explained.

First, the input terminal of the starter circuit 10b is supplied with the standby signal STB which goes high and low during the standby time (during cessation of the controlled operation) and after start of the operation, respectively.

In the standby state, the potential of the node ND2 of the input terminal IN1 is at a high level, so that the node ND5 on the output side of the inverter INV1 is at a low level. On the other hand, the transistor NT1 is in the on state, so that the node ND1 is kept at a low level, for example, at the ground potential GND. Since the output terminal of the NAND gate NA1 is maintained at a high level, depending on the output signals of the inverters INV1 and INV2, the transistor PT2 is turned off. Since the gate of the transistor PT3 is at a low level, the transistor PT3 is in the on-state, so that the signal terminal SN1 is at a high level, for example, at a level of the power supply voltage Vcc or its vicinity. At this time, the pMOS transistor PT1, the gate potential of which is at a high level, is in the off-state. On the other hand, the n-MOS transistor NT2 is in the on-state, however, the on-resistance across its source and drain is set to a high impedance on the order pf e.g., megaohm (MO).

When the standby signal STB is switched from the high level to the low level, the potential of the output node ND5 of the inverter INV1 is changed over from the low level to the high level. As a result, the transistor PT3 is turned off, however, the signal terminal SN1 is maintained at a high level as long as no new signal is input at the signal terminal SN1.

When the standby signal STB is at the low level, the transistor NT1 is changed over from the o-state to the off-state. However, the signal terminal SN1 is maintained at a high level, so that the transistor PT1 is also simultaneously turned off. On the other hand, since the transistor NT2 is in the on-state and the source-gate current path of the transistor is in the high impedance state, the potential of the node ND1 is not changed but is kept in the low level.

Since two input terminals of the NAND gate NA1 are both at a high level, the output side node ND5 of the NAND gate NA1 is kept at a low level. This turns on the transistor PT2 to supply the startup current $I_{ST}$ to the output terminal OUT1. Responsive to the current $I_{ST}$, supplied to the output terminal OUT1, the main circuit, for example, the band gap reference voltage circuit 20u, shown in FIG. 2, starts its operation. When the main circuit is in the regular operating state, the voltage of the signal terminal SN1, for example, the voltage at the node n3 of the band gap reference voltage circuit 20u, begins to be lowered, as a result of which the source-drain resistance of the pMOS transistor PT1 begins to be reduced. This increases the potential of the node ND1. At a certain time point, the output terminal ND4 of the inverter INV2 is changed over from the high level to the low level, such that the output terminal of the NAND gate NA1 is changed over from the low level to the high level. This turns off the pMOS transistor PT2 such that the main circuit, for example, the band gap reference voltage circuit 20u, commences its operation.

The operation of the starter circuit 10b when the operation of the main circuit, so far operating as normally, has ceased, by some reason or other, with the standby signal STB remaining in the low level, is hereinafter explained.

First, when the standby terminal IN1 is at a low level, and the main circuit is operating as normally, the nodes ND2, ND5 are at the low level and at the high level, respectively. The signal terminal SN1 is connected to a point n3, the voltage of which is lowered, during the normal operation of the main circuit, to a value sufficient to turn on the pMOS transistor PT1, so that the voltage at the node ND3 is lowered to a value sufficient to turn on the pMOS transistor PT1. At this time, the pMOS transistor PT3 is turned off, because the node ND5 is at a high level.

Moreover, since the node ND3 is at the low level, the pMOS transistor PT1 is on, while the nMOS transistor NT1 is off, so that the node ND1 is at a high level. Consequently, the node ND4 on the output side of the inverter NV2 is at a low level, so that the node ND6 on the output side of the NAND gate NA1 is at a high level, while the pMOS transistor PT12 is off. Meanwhile, since the on-resistance of the nMOS transistor NT2 is larger than the on-resistance of the nMOS transistor PT1, the above-described operation is not affected even if the node ND1 is at a high level.

If the main circuit, so far operating as normally, has halted its operation, by some reason or other, with the standby signal STB remaining in the low level, the node ND2 of the input terminal IN1 is in the low level, while the output node ND5 of the inverter INV1 remains in the high level, so that the pMOS transistor PT3 also remains off. On the other hand, during the cessation of operation of the main circuit, the signal terminal SN1 is at a high level indicating the unusual state. At this time, the pMOS transistor PT1 and the nMOS transistor NT1 are both off. It is noted that, since the on-resistance of the nMOS transistor NT2 is lower than the off-resistance of the pMOS transistor PT1, the node ND1 is at a low level. Thus, the output side node ND4 of the inverter INV2 is at a high level, while the output side node ND6 of the NAND gate NA1 is at a low level. Consequently, the pMOS transistor PT2 is turned on to cause the startup current $I_{ST}$ to flow from the output terminal OUT1 through the terminal $T_{n2}$ to the main circuit, for example, the band gap reference voltage circuit 20u, so that the main circuit starts its operation.

When the main circuit begins to revert to its regular operation, the voltage at the signal terminal SN1 again begins to be lowered to a voltage sufficient to turn the transistor PT1 on. When the voltage at the node ND3 is lowered to a voltage sufficient to turn the transistor PT1 on, the pMOS transistor PT1 is turned on, while the nMOS transistor NT1 is turned off. The nMOS transistor NT2 at this time is in such an operating range that its on-resistance appears to be larger than the on-resistance of the pMOS transistor PT1, so that the potential of the node ND1 is raised to a high level. Thus, the output side node ND4 of the inverter INV2 is at a low level, so that the potential of the output side ND6 of the NAND gate NA1 is at a high level to turn off the pMOS transistor PT2 again so that the band gap reference voltage circuit 20u as the main circuit starts its regular operation.

Thus, the starter circuit 10b of the third embodiment, shown in FIG. 8, operates similarly to the starter circuit 10a of the second embodiment shown in FIG. 7, except that the on-resistance of the transistor NT2 cannot be actively changed in contradistinction from the circuit of FIG. 7.

<Fourth Embodiment>

Figure 9:
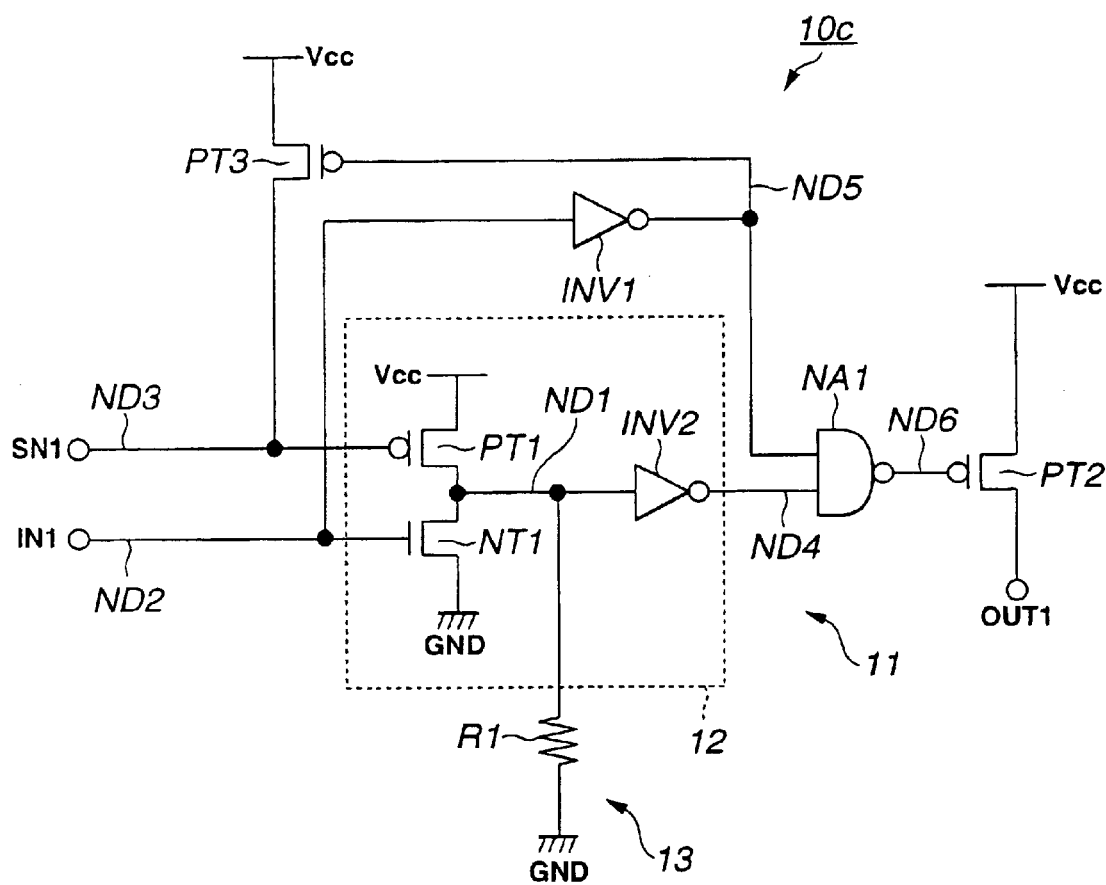
FIG. 9 is a circuit diagram showing a comparative embodiment to a fourth embodiment of the present invention.

In the above-described third embodiment, the on-resistance of the n-MOS transistor NT2 is fixed, because the gate voltage is fixed. If this concept is expanded, the nMOS transistor NT2 in the starter circuit 10b of the third embodiment can be replaced by a fixed resistor R1, as in the case of the starter circuit 10c fourth embodiment shown in FIG. 9. In the present fourth embodiment, in which the nMOS transistor NT2 is not used, the simplified structure as well as reduced cost may be achieved. The operation is similar to the operation of the third embodiment and hence the explanation is omitted for simplicity.

If the starter circuit 10c of the fourth embodiment is compared to the starter circuit 10b of the third embodiment, it is necessary with the starter circuit 10c of the fourth embodiment to use a resistor of the MΩ order resistance as the fixed resistor R1 in order to achieve the low power consumption, while the cell area is increased if the circuit is implemented as an integrated circuit. If the resistance value is decreased to decrease the cell area, power consumption would be considerable. In the starter circuit 10b of the third embodiment, the on-resistance of the nMOS transistor NT2 is used as the fixed resistance, thus giving a merit that, if the circuit is implemented as an integrated circuit, reduction in the cell area and in power consumption may advantageously be achieved.

<Fifth Embodiment>

Figure 10:
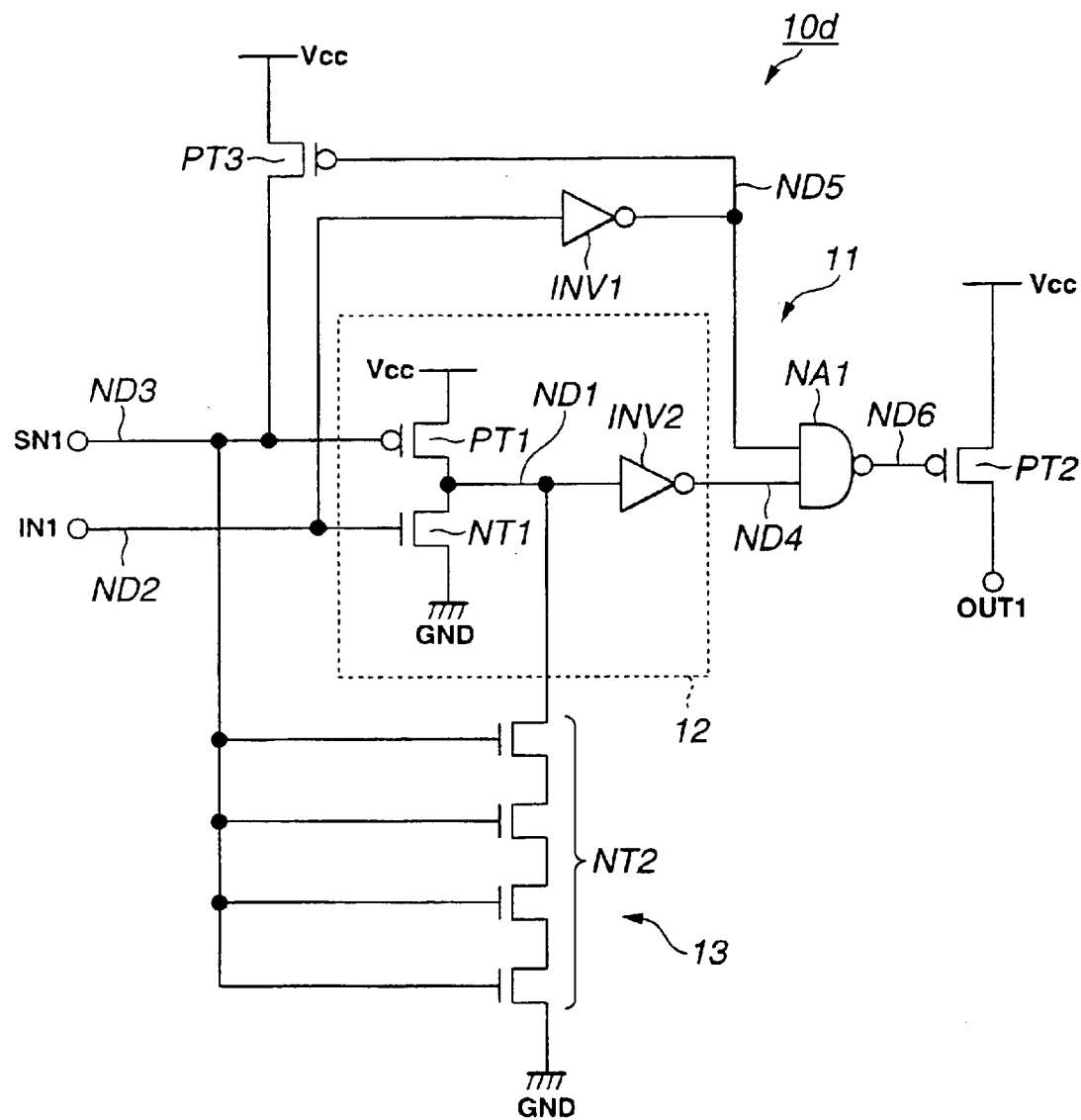
FIG. 10 is a circuit diagram showing a fifth embodiment of the present invention.

FIG. 10 shows a starter circuit 10d according to a fifth embodiment of the present invention. The present fifth embodiment is common to the starter circuit 10b of the second embodiment shown in FIG. 7 except that plural nMOS transistors are discretely provided in place of the sole nMOS transistor NT2.

In forming the fifth embodiment, nMOS transistor NT2 by the integrated circuit, plural nMOS transistors are formed on the substrate, and the respective gates are connected common and connected to the node ND3, whereby the substrate bias effect is demonstrated, such that the on-resistance of the transistor appears to be larger than with the starter circuit 10a of the second embodiment shown in FIG. 7.

The circuit operation is similar to that of the starter circuit 10b of the second embodiment.

In the starter circuit 10d of the fifth embodiment, plural nMOS transistors are formed in place of the nMOS transistor NT2 of the starter circuit 10b of the second embodiment. If plural nMOS transistors are formed in place of the nMOS transistor NT2 of the third embodiment, the operation similar to that of the third embodiment may, of course, be achieved.

<Sixth Embodiment>

Figure 11:
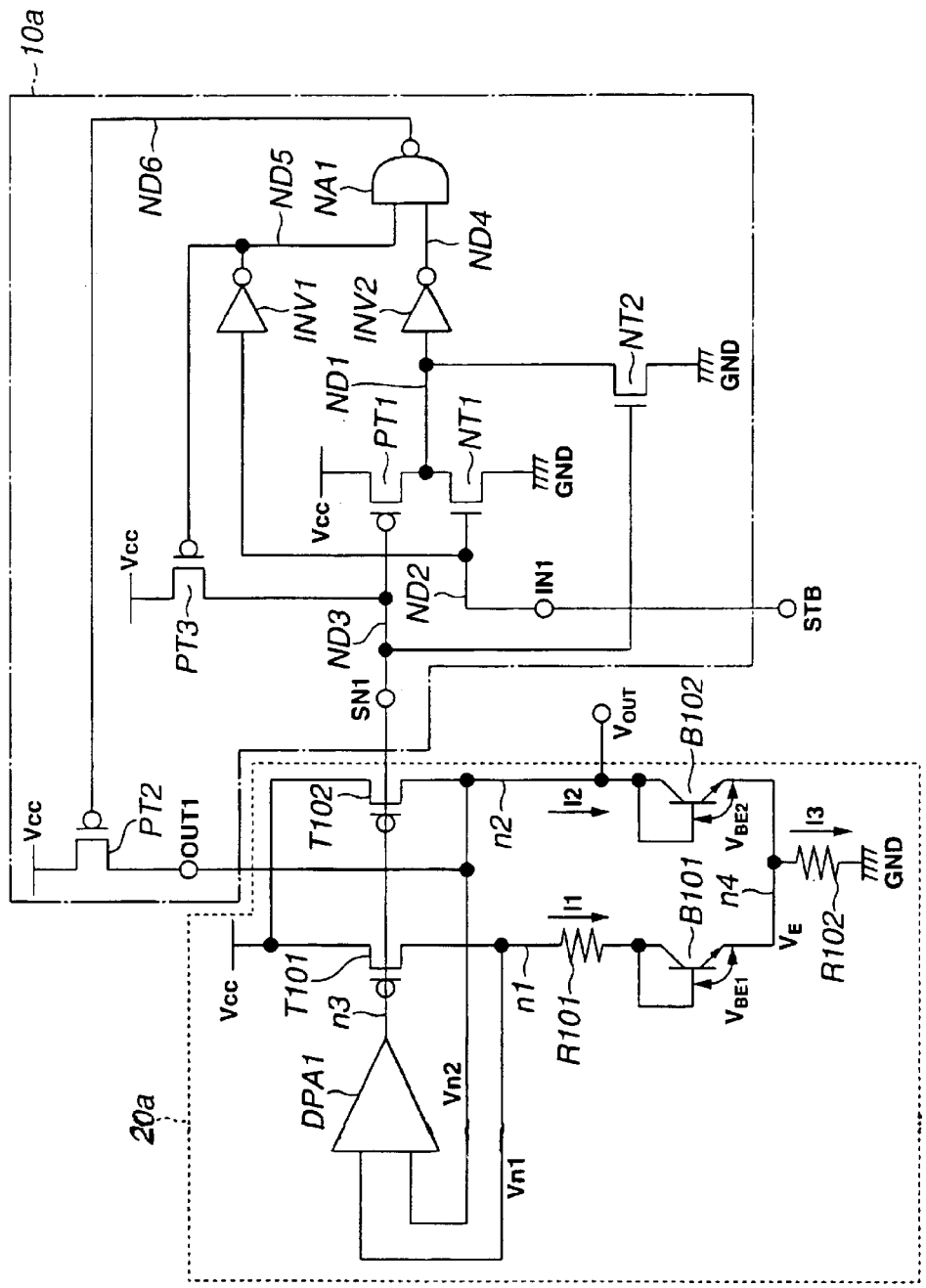
FIG. 11 is a circuit diagram showing an embodiment in which the starter circuit of the second embodiment of the present invention is combined with the band gap reference voltage circuit.

FIG. 11 is a circuit diagram in case the starter circuit 10a of the second embodiment is applied to a band gap reference voltage circuit 20a. First, the band gap reference voltage circuit 20a is explained.

The band gap reference voltage circuit 20a, shown in FIG. 11, is made up by an operational amplifier OPA1, pMOS transistors T101, T102, resistor elements R101, R102, and npn transistors B101, B102, connected in a diode configuration.

The transistor T101, resistor element R101 and the transistor B101, connected in a diode configuration, are connected in series across the supply line of the power supply voltage Vcc and the node n4, while the transistor T102 and the transistor B102, connected in a diode configuration, are connected in series across the supply line of the power supply voltage Vcc and the node n4. The gates of the transistors T101, T102 are connected to the output terminal of the operational amplifier OPA1, so that currents I1 and I2 are output responsive to an output signal of the operational amplifier OPA1, respectively.

The non-inverting input terminal (+) of the operational amplifier OPA1 is connected to the node n1, which is the junction point of the transistor T101 and the resistor element R101, while the inverting input terminal (−) thereof is connected to the node n2 which is the junction point between the transistors T102 and B102. The node n2 forms an output terminal of the band gap reference voltage circuit 20a. During the regular operation, a constant voltage $V_{OUT}$, exhibiting no power supply voltage dependency nor temperature dependency, is output from this output terminal.

An output signal of the operational amplifier OPA1 is applied to the gates of the transistors T101, T102. This forms a feedback loop by the operational amplifier OPA1. By controlling this feedback loop, output currents I1 and I2 of the transistors T101, T102 are controlled so that the voltages $V_{n1}$ and $V_{n2}$ will be equal to each other during the normal operation. If the channel widths of the transistors T101, T102 are set so as to be equal to each other, the output currents I1, I2 of these transistors are equal to each other. The emitter size of the transistor B101 is set so as to be ten times that of the transistor B102.

In comparison with the band gap reference voltage circuit 20u, shown in FIG. 2, the band gap reference voltage circuit 20a of the instant embodiment is not provided with the transistor T102, resistor element B102 nor with the transistors B103, and a reference voltage $V_{OUT}$ is output from the junction point n2 of the transistors T102 and B102. The junction point of the emitters of the transistors B101, B102 is grounded via resistor element R102.

The operation of the circuit shown in FIG. 11 is now explained.

In the band gap reference voltage circuit 20a, shown in FIG. 11, the voltages $V_{n1}$, $V_{n2}$ of the nodes n1 and n2 are kept to be equal to each other, by control by the operational amplifier OPA1, so that $$V_{n1} - V_E = V_{n2} - V_E$$

holds, where $V_E$ is the voltage at the node n4. Thus, the following equation (1):

$$I_1 R_1 + V_{BE1} = V_{BE2} \tag{1}$$

is obtained, where $I_1$ is the current value of the current I1, $R_1$ is the resistance value of the resistor element R101 and $V_{BE1}$, $V_{BE2}$ denote the base-emitter voltages of the transistors B101 and B102, respectively. Thus, the following equations (2) and (3):

$$V_{BE1} = V_T ln(I_{c1}/I_{s1}) \tag{2}$$

$$V_{BE2} = V_T ln(I_{c2}/I_{s2}) \tag{3}$$

are obtained, where $V_T = kT/q$, k is the Boltzmann's constant, T is an absolute temperature, q is an electrical charge of an electron, $I_{C1}$ is the collector current of the transistor B101, $I_{S1}$ is the constant current value proportionate to the emitter size of the transistor B101, $I_{C2}$ is the collector current of the transistor B102, and $I_{S2}$ is the constant current value proportionate to the emitter size of the transistor B102.

Substituting the equations (2) and (3) into the equation (1), and using the condition that $I_{C1} = I_1$ and $I_{C2} = I_2$, and that the emitter size of the transistor B101 is ten times that of the transistor B102, that is that $I_{S1} = 10 I_{S2}$, the following equation (4):

$$I_1 = V_T(\ln 10)/R_1 \quad (4)$$

is obtained.

The resistance value of the resistor element R102 is assumed to be R10. The current I3 flowing through the resistor element R102 is the sum of the current I1 and I2. That is, if the current value of the current I3 is $I_3$, $I_3=(I_1+I_2)=2I_1$ is obtained, provided that $I_1=I_2$. Thus, an output voltage $V_{OUT}$ may be found from the following equation (5):

$$V_{OUT} = V_{BE2} + I_3 R_{10} = V_{BE2} + 2V_T(\ln 10)R_{10}/R_1 \quad (5)$$

The base-emitter voltage $V_{BE2}$ has negative temperature characteristics and, for example, $d(V_{BE2})/dT = -2$ mV/K. Thus, by setting the temperature characteristics of the second term of the right side of the equation (5) to 2 mV/K, the temperature dependency of the output voltage $V_{OUT}$ can be eliminated completely. Meanwhile, since $V_T = kT/q$, the condition under which the temperature dependency of the output voltage $V_{OUT}$ may be eliminated is found from the following equation (6):

$$2\ln 10(R_{10}/R_1)(k/q) = 2 \; mV/K \quad (6)$$

When the resistor elements R102, R101 meet the condition (6), the output voltage $V_{OUT}$ is not dependent on temperature changes and becomes a constant voltage at all times. Meanwhile, if the equation (6) is met, and the temperature is 300 K (27° C.), the second term of the right side of the equation (5) is $$(2V_T(\ln 10)R_{10}/R_1) = 0.6V.$$

Moreover, if the base-emitter voltage $V_{BE2}$ of the transistor B102 is 0.65 V, it follows from the equation (5) that the output voltage $V_{OUT}$ of the band gap reference voltage circuit 20a is 1.25 V.

As described above, with the band gap reference voltage circuit 20a of the present embodiment, a constant output voltage $V_{OUT}$ is obtained, without dependency upon changes in temperature. Moreover, in normal operation, the drain potentials of the transistors T101 and T102 are controlled to be equal to each other by feedback control of the operational amplifier OPA1. That is, since the drain-source voltages $V_{ds}$ of the transistors T101 and T102 are controlled to be equal to each other, the currents I1 and I2, flowing through these transistors, may be set to be equal at all times, thus enabling the suppression of the power supply voltage dependency of the output voltage $V_{OUT}$.

The operation when the starter circuit 10a and the band gap reference voltage circuit 20a are combined together is now explained.

Referring to FIG. 11, the output terminal OUT1 of the starter circuit 10a is connected to the node n2 of the band gap reference voltage circuit 20a, while the signal terminal SN1 is connected to the node n3 of the band gap reference voltage circuit 20a, and the standby signal STB, which goes to a high level and to a low level during standby and on startup, respectively, is applied to the input terminal IN1.

During the standby state, the potential of the node ND2 of the input terminal IN1 is at a high level, so that the node ND5 on the output side of the inverter INV1 is at a low level. Since the transistor NT1 is on, the node ND1 is at a low level, for example, at the level of the ground potential GND. Responsive to the output signals of the inverters INV1, INV2, the output terminal of the NAND gate NA1 is maintained at a high level, so that the transistor PT2 is off. On the other hand, since the gate of the transistor PT3 is at a low level, the transistor PT3 is on, so that the signal terminal SN1 is at a high level, for example, at or near the power supply voltage Vcc. At this time, the pMOS transistor T101, the gate potential of which is at a high level, is off, while the nMOS transistor NT2 is on.

When the standby signal STB is changed over from the high level to the low level, the potential of the output side node ND5 of the inverter INV1 is changed over from the low level to the high level, after a slight time lag as from the decay of the standby signal STB. Concomitantly, the transistor PT3 is turned off, however, the signal terminal SN1 is maintained at a high level, because no new signal is supplied at the signal terminal SN1.

When the standby signal STB is at the low level, the transistor NT1 is changed over from the on-state to the off-state, as described above. Since the signal terminal SN1 is maintained at a high level, the transistor PT1 is simultaneously turned off. On the other hand, since the signal terminal SN1 is maintained at a high level, the transistor NT2 is on, with its source gate current path being low in impedance. Thus, the voltage at the node ND1 is unchanged and is maintained at the low level.

Since the two input terminals of the NAND gate NA1 are at a high level, the output side node ND5 of the NAND gate NA1 is maintained at a low level. As a result, the transistor PT2 is turned on, so that the output terminal OUT1 is at a high level and hence the band gap reference voltage circuit 20a begins its operation. When the band gap reference voltage circuit 20a begins its operation as normally, the voltage at the node n3 of the band gap reference voltage circuit 20a begins to be lowered. As a result, the source-drain resistance of the pMOS transistor PT1, the gate of which is connected to the signal terminal SN1, begins to be decreased. Simultaneously, the source-drain resistance of the nMOS transistor NT2 begins to be increased. Thus, the potential at the node ND1 is increased and, at a certain time point, the output terminal ND4 of the inverter INV2 is changed over from the high level to the low level, while the output terminal of the NAND gate NA1 is changed over from the low level to the high level. This turns off the pMOS transistor PT2 so that the band gap reference voltage circuit 20a begins its normal operation.

The operation of the starter circuit 10a when the main circuit, so far operating as normally, has stopped its operation, by some reason or other, with the standby signal STB remaining in the low level, is now explained with reference to the timing chart of FIG. 12. In this figure, A denotes a range of the normal operation, B denotes a range since the time of cessation of the circuit operation until the time of start thereof, and C denotes a range for normal operation.

First, if the band gap reference voltage circuit 20a has started its operation, with the input terminal IN1 remaining at a low level, the nodes ND2 and ND5 are at low and high levels, respectively, for the levels A to C in their entirety, as shown in FIG. 12A.

The signal terminal SN1 is connected to the node n3, which is a point where the voltage is lowered to a value sufficient to turn on the pMOS transistor PT1 during normal operation of the band gap reference voltage circuit 20a, so that, during the time of the normal operation A, the voltage at the node ND3 is decreased to a value sufficient to turn on the pMOS transistor PT1, as shown in FIG. 12G. Since the node ND5 is at a high level at this time, the pMOS transistor PT3 is off.

Since the node ND3 is at a low level, the pMOS transistor PT1 is on, while the nMOS transistor NT1 is off. Since the voltage at the node ND3, representing the gate voltage of the nMOS transistor NT2, is at a low level, the gate-source voltage $V_{gs}$ is smaller than that for the high level of the voltage at the node ND3, so that the on-resistance of the transistor NT2 appears to be larger, and hence the node ND1 is at a high level. Consequently, the node ND4 on the output side of the inverter INV2 is at the low level, so that the output side node ND6 of the NAND gate NA1 is at a high level and hence the pMOS transistor PT2 is off.

It is now supposed that the potential at the node n1 becomes higher at time $t_{10}$ of FIG. 12 following the end of the regular operation of the band gap reference voltage circuit 20a than that at the node n2, by some reason or other (see FIG. 12F), with the standby signal STB remaining at the low level, and that, in an attempt to compensate for this, the voltage of the operational amplifier OPA1 is increased to an upper limit value of the main voltage, as shown in FIG. 12G, with the transistors T101, T102 being turned off to cause the operation cessation. In such case, the node ND2 of the input terminal IN1 keeps on to be at a low level, while the node ND5 on the output side of the inverter INV1 keeps on to be at a high level, so that the pMOS transistor PT3 keeps on to be off. Meanwhile, during cessation of the operation of the band gap reference voltage circuit 20a, the signal terminal SN1, connected to the node n3, is at a high level, indicating the unusual state. Consequently, the pMOS transistor PT1 and the nMOS transistor NT1 are both off, while the nMOS transistor NT2 is on, because its gate voltage is at a high level. Since the gate-source voltage $V_{gs}$ of the nMOS transistor NT2 is large, the on-resistance of the transistor appears to be small, and hence the voltage at the node ND1 begins to be lowered, as shown in FIG. 12C. At a time $t_{11}$ when a certain preset threshold value is reached, the output side node ND4 of the inverter INV2 is at a high level, while the output side ND6 of the NAND gate NA1 is at a low level (see FIGS. 12D and 12E). Thus, the pMOS transistor PT2 is turned on to cause the startup current $I_{ST}$ to flow from the output terminal OUT1 via terminal $T_{n2}$ to the band gap reference voltage circuit 20a to start the circuit operation.

If the band gap reference voltage circuit 20a begins to revert to its normal operation in this manner, the voltage at the signal terminal SN1 begins again to be lowered, at a time $t_{12}$, to a voltage sufficient to turn the transistor PT1 on. At a time point $t_{13}$ when the voltage at the node ND3 has been lowered to a voltage sufficient to turn on the transistor PT1, the pMOS transistor PT1 is turned on, while the nMOS transistor NT1 is turned off, as described above. The nMOS transistor NT2 at this time is in such an operating range that the gate voltage is smaller than in the high level and hence the on-resistance of the transistor appears to be larger. Thus, the potential of the node ND1 is raised to the high level. Thus, the output side node ND4 of the inverter INV2 is at the low level, and hence the potential at the output side node ND6 of the NAND gate NA1 is at a high level (see FIGS. 12D and 12E). Consequently, the pMOS transistor PT2 is again turned off, such that the band gap reference voltage circuit 20a begins its normal operation.

Industrial Applicability

Since the present invention is provided with re-start signal generating means for supplying re-start signals to the circuit startup node of the main circuit, the voltage of the voltage monitor mode is monitored at all times, even after the standby signal is at a startup level. If the main circuit, such as the band gap reference voltage circuit, has failed to perform its regular operation, by some reason or other, or the main circuit, so far operating as normally, has stopped its operation, the re-start operation of the main circuit cam be carried out automatically.

The re-start signal generating means may be formed by a transistor, having an output terminal connected across an input side of a logic element of startup controlling means or a power supply voltage line and a ground line and also having a gate terminal connected to the voltage monitor node, or a by fixed resistor, so that the re-start signal generating means may be implemented by adding a transistor to the conventional circuit.

The re-start signal generating circuit of a low power consumption may also be achieved by constructing the transistor forming the re-start signal generating circuit by a field effect transistor, in particular the MOS field effect transistor, and by controlling its gate voltage as necessary.

Moreover, in constructing the MOS field effect transistor, forming the re-start signal generating circuit, plural MOS field effect transistors are formed on a substrate and interconnected in series for use as an apparently sole MOS field effect transistor, whereby the substrate bias effect is demonstrated, such that the on-resistance of the transistor appears to be larger than if a single transistor is used, thus achieving a high resistance circuit at a low power consumption.

What is claimed is:

1. A starter circuit for a main circuit, connected to a preset voltage monitor node and to a preset circuit startup node in said main circuit, comprising:

startup signal supplying means which, on receipt of a standby signal, changed in voltage on startup from a standby level to a start level in a bi-level fashion, supplies a stop signal for stopping the operation of said main circuit when said standby signal is at a standby level, said startup signal supplying means supplying a startup signal to said circuit startup node of said main circuit and stopping the supply of said step signal when said standby signal is changed from said standby level to said start level;

startup controlling means for stopping the supply of said startup signal when said standby signal is at a startup level and when the voltage at said voltage monitor node of said main circuit has reached a predetermined value; and re-start signal generating means for supplying a re-start signal to said circuit startup node of said main circuit when said standby signal is at said startup level and when the voltage of said voltage monitor node of said main circuit is changed from said preset value to an unusual value.

2. The starter circuit according to claim 1 wherein said startup controlling means includes a first field effect transistor and a second field effect transistor, having output terminals connected in series across a power supply voltage line and a grounding line, a voltage of said voltage monitor node being supplied to the gate of said first field effect transistor, said standby signal being supplied to the gate of said second field effect transistor, said startup controlling means also including a logical element for binary encoding the voltage at a junction point of an output terminal of said first transistor and an output terminal of said second transistor, with a predetermined threshold value;

said re-start signal generating means being a third field effect transistor having an output terminal connected across an input side of said logical element of said startup controlling means and the grounding line and having a gate connected to said voltage monitor node;

said startup signal supplying means including a first inverter for inverting said standby signal, a NAND gate for forming an inverted output of a logical product of an output of the logical element of said startup controlling means and an output of said first inverter, a fourth field effect transistor having its gate connected to an output of said NAND gate and having an output terminal connected across a power supply voltage line and said circuit startup node of said main circuit, and a fifth field effect transistor having its gate connected to an output of said first inverter and having an output terminal connected across a power supply voltage line and said voltage monitor node.

3. The starter circuit according to claim 1 wherein said startup controlling means includes a first field effect transistor and a second field effect transistor, having output terminals connected in series across a power supply voltage line and a grounding line, a voltage of said voltage monitor node being supplied to the gate of said first field effect transistor, said standby signal being supplied to the gate of said second field effect transistor, and a logical element for binary encoding the voltage at a junction point of an output terminal of said first transistor and an output terminal of said second transistor, with a predetermined threshold value;

said re-start signal generating means being a resistor element connected across an input side of said logical element of said startup controlling means and a grounding line;

said startup signal supplying means including a first inverter for inverting said standby signal, a NAND gate for forming an inverted output of a logical product of an output of the logical element of said startup controlling means and an output of said first inverter, a fourth field effect transistor having its gate connected to an output of said NAND gate and having an output terminal connected across a power supply voltage line and said circuit startup node of said main circuit, and a fifth field effect transistor having its gate connected to an output of said first inverter and having an output terminal connected across said power supply voltage line and said voltage monitor node.

4. The starter circuit according to claim 3 wherein the resistor element in said re-start signal generating means is a third field effect transistor having an output terminal connected across an input side of said logical element of said startup controlling means and the grounding line and having its gate connected to a power supply voltage line.

5. The starter circuit according to claim 3 wherein the first field effect transistor in said startup controlling means is a pMOS field effect transistor, said second field effect transistor is a nMOS field effect transistor and said logical element is an inverter;

said third first field effect transistor in said re-start signal generating means being a nMOS field effect transistor.

6. The starter circuit according to claim 4 wherein the first field effect transistor in said startup controlling means is a pMOS field effect transistor, said second field effect transistor is a nMOS field effect transistor and said logical element is an inverter;

said third first field effect transistor in said re-start signal generating means being a nMOS field effect transistor.

7. The starter circuit according to claim 5 wherein the nMOS field effect transistor of said re-start signal generating means is a plurality of nMOS field effect transistors discretely formed on a circuit forming substrate, said plural nMOS field effect transistors having output sides connected in series with one another and having gates connected in common.

8. The starter circuit according to claim 6 wherein the nMOS field effect transistor of said re-start signal generating means is a plurality of nMOS field effect transistors discretely formed on a circuit forming substrate, said plural nMOS field effect transistors having output sides connected in series with one another and having gates connected in common.

\* \* \* \* \*

UNITED STATES PATENT AND TRADEMARK OFFICE
CERTIFICATE OF CORRECTION

PATENT NO. : 6,833,742 B2
DATED : December 21, 2004
INVENTOR(S) : Yasuhide Shimizu and Keiko Asai It is certified that error appears in the above-identified patent and that said Letters Patent is hereby corrected as shown below:

<u>Title page,</u>
Item [30], please add the following:
-- [30]   Foreign Application Prority Data - August 3, 2001 (JP) 2001-237060 --

Signed and Sealed this

Third Day of May, 2005

JON W. DUDAS
*Director of the United States Patent and Trademark Office*